(12) United States Patent
Gong (10) Patent No.: US 11,037,959 B2
(45) Date of Patent: Jun. 15, 2021

(54) METHOD OF PRODUCING ARRAY SUBSTRATE, ARRAY SUBSTRATE, AND DISPLAY APPARATUS

(71) Applicants: BOE Technology Group Co., Ltd., Beijing (CN); Hefei BOE Optoelectronics Technology Co., Ltd., Anhui (CN)

(72) Inventor: Kui Gong, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 280 days.

(21) Appl. No.: 16/074,842

(22) PCT Filed: Oct. 31, 2017

(86) PCT No.: PCT/CN2017/108567
§ 371 (c)(1),
(2) Date: Aug. 2, 2018

(87) PCT Pub. No.: WO2018/171199
PCT Pub. Date: Sep. 27, 2018

(65) Prior Publication Data
US 2020/0194460 A1    Jun. 18, 2020

(30) Foreign Application Priority Data

Mar. 24, 2017  (CN) .......................... 201710184240.5

(51) Int. Cl.
*H01L 27/12* (2006.01)
*H01L 21/02* (2006.01)
(Continued)

(52) U.S. Cl.
CPC ........ *H01L 27/124* (2013.01); *H01L 21/0217* (2013.01); *H01L 21/31116* (2013.01);
(Continued)

(58) Field of Classification Search
CPC .............. H01L 27/124; H01L 21/0217; H01L 21/31116; H01L 21/31144;
(Continued)

(56) References Cited

U.S. PATENT DOCUMENTS 5,350,484 A    9/1994  Gardner et al.
6,284,666 B1   9/2001  Naeem et al.
(Continued)

FOREIGN PATENT DOCUMENTS

CN    102263111 A    11/2011
CN    103456624 A    12/2013
(Continued)

OTHER PUBLICATIONS

First Office Action, including Search Report, for Chinese Patent Application No. 201710184240.5, dated Apr. 26, 2019, 12 pages.
(Continued)

*Primary Examiner* — Hoang-Quan Ho
(74) *Attorney, Agent, or Firm* — Westman, Champlin & Koehler, P.A.

(57) ABSTRACT

Provided is a method of producing an array substrate. This method of producing an array substrate has following steps: forming a passivation layer on a base substrate; forming a photoresist layer on the passivation layer, and performing a patterning process on the photoresist layer to form a photoresist mask having an opening pattern; introducing an etching resistant layer precursor material to the passivation layer by ion injection through the opening pattern; generating plasma by using an etching gas, etching the passivation layer by using the plasma through the opening pattern to
(Continued)

form a via hole penetrating the passivation layer; and peeling the photoresist mask. Also provided are an array substrate and a display apparatus.

15 Claims, 4 Drawing Sheets

(51) Int. Cl.
    *H01L 21/311*     (2006.01)
    *H01L 21/3115*     (2006.01)
    *H01L 21/768*     (2006.01)

(52) U.S. Cl.
    CPC .. *H01L 21/31144* (2013.01); *H01L 21/31155* (2013.01); *H01L 21/76802* (2013.01); *H01L 21/76877* (2013.01); *H01L 27/1259* (2013.01)

(58) Field of Classification Search
    CPC ......... H01L 21/31155; H01L 21/76802; H01L 21/76877; H01L 27/1259; H01L 21/77
    See application file for complete search history.

(56) References Cited

U.S. PATENT DOCUMENTS

| | | |
|---|---|---|
| 2009/0111199 A1 | 4/2009 | Chang et al. |
| 2011/0291096 A1 | 12/2011 | Ryoo et al. |
| 2015/0303099 A1 | 10/2015 | Lee et al. |
| 2020/0285124 A1 * | 9/2020 | Duan ................. H01L 21/0217 |

FOREIGN PATENT DOCUMENTS

| | | | |
|---|---|---|---|
| CN | 104091782 A | | 10/2014 |
| CN | 106707649 A | | 5/2017 |
| CN | 106935545 A | * | 7/2017 |
| CN | 106935545 A | | 7/2017 |
| JP | H09-116030 A | | 5/1997 |
| WO | WO2018157601 A1 | * | 9/2018 |

OTHER PUBLICATIONS

International Search Report (including English translation) and Written Opinion (including English translation of Box V) for International Application No. PCT/CN2017/108567, dated Jan. 29, 2018, 16 pages.

* cited by examiner

METHOD OF PRODUCING ARRAY SUBSTRATE, ARRAY SUBSTRATE, AND DISPLAY APPARATUS

CROSS-REFERENCE TO RELATED APPLICATION

This application is a US National Stage Application of PCT Application No. PCT/CN2017/10867, filed on Oct. 31, 2017, entitled "METHOD OF PRODUCING ARRAY SUBSTRATE ARRAY SUBSTRATE AND DISPLAY APPARATUS" which claims the priority of Chinese Patent Application No. 201710184240.5 filed on Mar. 24, 2017, the entire contents of which are incorporated herein by reference.

TECHNICAL FIELD

This disclosure relates to the technical field of display, and particularly to a method of producing an array substrate, an array substrate, and a display apparatus.

BACKGROUND ART

At present, in the process of production and manufacture of TFT products, after the manufacture of a top protective passivation layer is complete, it is desired to form a via hole in the passivation layer by using a dry etching technique; and a top ITO is finally formed on the surface of the passivation layer, wherein the top ITO is in electrical connection with an S/D electrode.

In the manufacture process of a conventional TFT product, a silicon nitride, i.e. $SiN_x$, will be typically selected as the material for manufacturing a passivation layer, and this $SiN_x$ passivation layer is generally divided into three layers: a transition sublayer, a main sublayer, and a top sublayer. Here, the effect of the transition sublayer is preventing the generation of black spot badness caused by direct contact between the main body of the passivation layer and a pixel electrode, and the density of $SiN_x$ of the transition sublayer is relatively small; and effect of the top sublayer is playing a buffering role in plasma etching and allowing the via hole to achieve certain slope angle and size. Therefore, since loosenesses of sublayer structures are different, it results in different etching rates of various sublayers.

SUMMARY OF THE INVENTION

In an aspect of this disclosure, there is proposed a method of producing an array substrate, comprising:

forming a passivation layer on a base substrate;

forming a photoresist layer on the passivation layer, and performing a patterning process on the photoresist layer to form a photoresist mask having an opening pattern;

introducing an etching resistant layer precursor material to the passivation layer by ion injection through the opening pattern;

generating plasma by using an etching gas, etching the passivation layer by using the plasma through the opening pattern to form a via hole penetrating the passivation layer; and peeling the photoresist mask, wherein the plasma comprises a substance which is capable of reacting with the etching resistant layer precursor material to form an etching resistant layer which is resistant to isotropic etching, so that the etching resistant layer is formed on a surface of the passivation layer during the etching.

In one embodiment, the etching resistant layer precursor material includes $Al^{3+}$ ions, the etching gas comprises $O_2$, the substance which is capable of reacting with the etching resistant layer precursor material to form an etching resistant layer is oxygen plasma, and the etching resistant layer is an $Al_2O_3$ layer.

In one embodiment, the ion injection is metal evaporation vacuum arc ion injection.

In one embodiment, a cathode material in the metal evaporation vacuum arc ion injection is metal aluminum having a purity of no less than 90 wt %.

In one embodiment, the $Al^{3+}$ ions have an injection dosage of $4\times10^{16}$ to $6\times10^{16}$ ions/cm$^2$.

In one embodiment, the plasma further comprises $F^+$.

In one embodiment, the etching gas comprises at least one of $SF_6$ and $CF_4$.

In one embodiment, the passivation layer is produced from a silicon nitride.

In one embodiment, before forming the passivation layer on the base substrate, the method further comprises: forming a source/drain electrode layer on the base substrate.

In one embodiment, the method further comprises: after forming the via hole, forming a top ITO on the passivation layer, wherein the top ITO is in electrical connection with the source/drain electrode layer through the via hole.

In one embodiment, forming the passivation layer on the base substrate comprises:

forming a transition sublayer on a side of the source/drain electrode layer away from the base;

forming a main sublayer on a side of the transition sublayer away from the base; and forming a top sublayer on a side of the main sublayer away from the base.

In another aspect of this disclosure, there is proposed an array substrate produced by the method described above.

In another aspect of this disclosure, there is proposed a display apparatus comprising the array substrate described above.

DESCRIPTION OF DRAWINGS

The above and/or additional aspects and advantages of this disclosure will become apparent and be easily understood from the following description of embodiments in conjunction with accompanying drawings, in which.

DESCRIPTION OF EMBODIMENTS

Additional aspects and advantages of this disclosure will be partly set forth in the following description, and other parts will become apparent from the following description or be understood from the practice of embodiments of this disclosure.

The meanings of reference numerals of this disclosure are as follows:

REFERENCE NUMERALS 1 undercut
100 passivation layer
110 transition sublayer
120 main sublayer
130 top sublayer
200 S/D electrode layer
300 photomask
400 etched groove
410 protective film
500 via hole
600 top ITO
700 base substrate This disclosure aims to at least solve one of technical problems in the related art to some extent.

Figure 1:
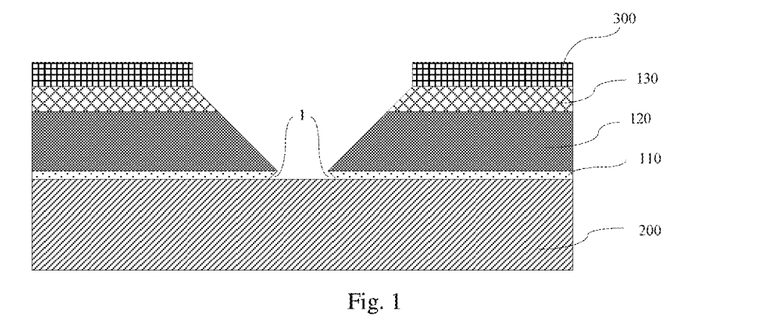
FIG. 1 is a structural schematic diagram of an undercut chamfer after etching a via hole of a passivation layer in an embodiment of the related art.
Figure 2:
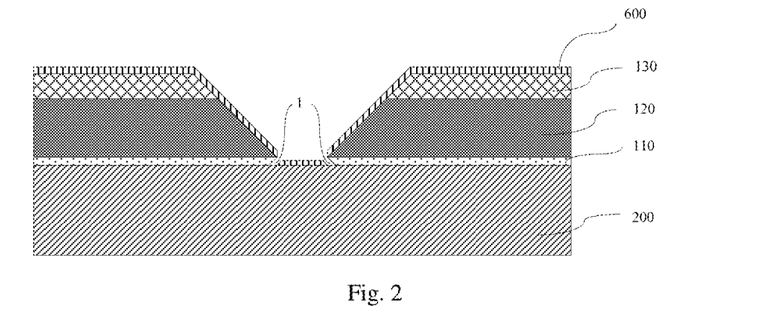
FIG. 2 is a structural schematic diagram of discontinuity of the discontinuity of the contact between a top ITO and an S/D electrode layer in an embodiment of the related art.
Figure 3:
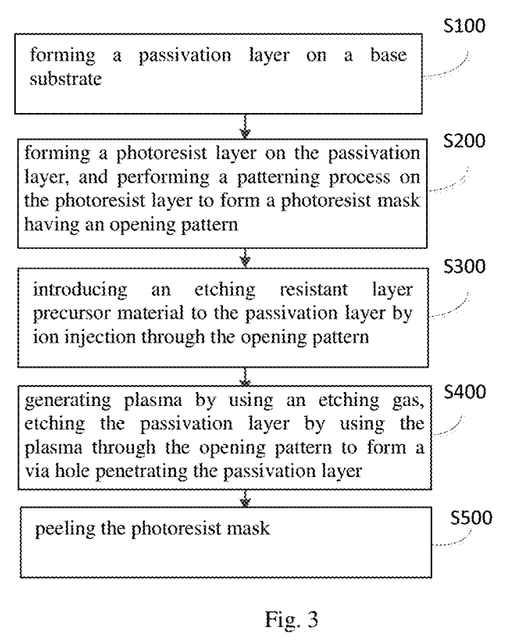
FIG. 3 is a schematic flow chart of a method of producing an array substrate in an embodiment of this disclosure.

During the investigation, the applicant has found that in a conventional step of manufacturing a via hole of a passivation layer of a TFT product, active plasma is used to perform etching and the plasma will easily enter a relatively loose top sublayer, and the object of etching can be achieved. When the transition sublayer is etched, indentation is generated since the etching rate of the transition sublayer is different from that of the main sublayer (i.e., the degree of the lateral etching of the transition sublayer is greater than that of the base of the adjacent main sublayer), and a phenomenon of an undercut chamfer is thus generated. A specific structural schematic diagram can be referred to FIG. 1. When the top ITO layer is formed on this passivation layer subsequently, it will easily result in a problem of discontinuity of the contact between the top ITO layer and the S/D electrode layer, as shown in FIG. 2. Therefore, display abnormality or even display failure may be caused, and finally it may result in a reduced yield rate of the manufacture of TFT substrates.

In the process of plasma etching, besides the material which is in the plasma bombardment direction is etched off, the material which is not in the plasma bombardment direction may also be etched off for some reasons. One of the reasons is the effect of chemical corrosion of certain ions. In this disclosure, the etching in the plasma bombardment direction is referred to as anisotropic etching, and the physical collision between the plasma and an etched matter plays a large role in this etching. On the contrary, the etching which is not limited to the plasma bombardment direction is referred to as isotropic etching, which exhibits lateral etching. As an example, when the material to be etched is a silicon nitride and there are fluoride ions in the plasma, the material to be etched will also be corroded by fluoride ions in the lateral direction besides it is etched by the plasma in the depth direction. When the underlying material to be etched has a resistance to isotropic etching, which is lower than that of the overlying material, a phenomenon of an undercut chamfer may occur.

To this end, an etching resistant layer precursor material is used in this disclosure. By ion injection, the etching resistant layer precursor material is distributed in the material to be etched. The distribution of the precursor material may be uniform distribution. Subsequently, an etching gas is used to generate plasma for plasma etching. The etching gas may be one gas or a mixture of several gases. After the plasma is generated, the surface of the material to be etched is bombarded by the plasma under the effect of an electric field to etch this material. The etching resistant layer precursor material in this disclosure may react with at least one substance in the plasma to form a thin etching resistant layer on the surface of the material to be etched. This etching resistant layer may be tolerant to isotropic etching, for example tolerant to chemical corrosion of certain substances in the plasma. Thus, lateral etching may be prevented or slowed. At the meanwhile, since the etching resistant layer on the surface in the plasma bombardment direction may be etched off at least due to the effect of physical strikes, anisotropic etching is not prevented by the etching resistant layer.

Specifically, in an etching process of a silicon nitride passivation layer having a transition sublayer, after a pattern of a photoresist mask for a via hole of the passivation layer is manufactured, metal aluminum ion injection is first performed by using the pattern of the photoresist mask as a blocking layer to allow metal aluminum ions to be uniformly distributed in the silicon nitride in an area which is not protected by the photoresist. In this way, a thin layer of protective film with a strong resistance to plasma etching will be generated by the metal aluminum in the surface layer on both side walls of the etched groove, in the process of etching the silicon nitride passivation layer by using an etching gas. Therefore, the passivation layer may be protected from being excessively laterally etched in the etching process so as to prevent the occurrence of the technical problem of undercut chamfers. The passivation layer of this invention may be, but not limited to, a passivation layer between a source/drain electrode and an ITO layer.

In view of this, an object of this disclosure is to propose a method of producing an array substrate, which effectively controls the etching direction of the passivation layer, prevents the problem of undercut chamfers, or has simple operation.

In an aspect of this disclosure, there is proposed a method of producing an array substrate, comprising:

forming a passivation layer on a base substrate;

forming a photoresist layer on the passivation layer, and performing a patterning process on the photoresist layer to form a photoresist mask having an opening pattern;

introducing an etching resistant layer precursor material to the passivation layer by ion injection through the opening pattern;

generating plasma by using an etching gas, etching the passivation layer by using the plasma through the opening pattern to form a via hole penetrating the passivation layer; and peeling the photoresist mask, wherein the plasma comprises a substance which is capable of reacting with the etching resistant layer precursor material to form an etching resistant layer which is resistant to isotropic etching, so that the etching resistant layer is formed on a surface of the passivation layer during the etching.

In one embodiment, the etching resistant layer precursor material includes $Al^{3+}$ ions, the etching gas comprises $O_2$, the substance which is capable of reacting with the etching resistant layer precursor material to form an etching resistant layer is oxygen plasma, and the etching resistant layer is an $Al_2O_3$ layer.

In one embodiment, the ion injection is metal evaporation vacuum arc ion injection.

In one embodiment, a cathode material in the metal evaporation vacuum arc ion injection is metal aluminum having a purity of no less than 90 wt %.

In one embodiment, the $Al^{3+}$ ions have an injection dosage of $4\times10^{16}$ to $6\times10^{16}$ ions/cm$^2$.

In one embodiment, the plasma further comprises $F^+$.

In one embodiment, the etching gas comprises at least one of $SF_6$ and $CF_4$.

In one embodiment, the passivation layer is produced from a silicon nitride.

In one embodiment, before forming the passivation layer on the base substrate, the method further comprises: forming a source/drain electrode layer on the base substrate.

In one embodiment, the method further comprises: after forming the via hole, forming a top ITO on the passivation layer, wherein the top ITO is in electrical connection with the source/drain electrode layer through the via hole.

In one embodiment, forming the passivation layer on the base substrate comprises: forming a transition sublayer on a side of the source/drain electrode layer away from the base;

forming a main sublayer on a side of the transition sublayer away from the base; and forming a top sublayer on a side of the main sublayer away from the base.

In an aspect of this disclosure, there is proposed a method of producing an array substrate.

According to an embodiment of this disclosure, the method comprises: forming a passivation layer on a base substrate; forming a photoresist layer on a side of the passivation layer away from the base, and performing a patterning process on the photoresist layer to form a photomask having an opening pattern; performing ion injection on an area of the passivation layer corresponding to the opening pattern; etching the area of the passivation layer corresponding to the opening pattern to form a via hole penetrating the passivation layer; and peeling the photomask.

By using the production method in embodiments of this disclosure, metal ions are preliminarily injected so that a thin layer of protective film on the two side walls and the bottom wall of the groove in the etching process of the passivation layer. Since the protective film on the bottom wall will be etched off more easily compared to that on the two side walls, the etching speed in the vertical direction is higher than the etching speed in the lateral direction. Therefore, the etching direction of the passivation layer may be effectively controlled, and the problem of the reduced yield rate of the manufacture of the array substrate brought about by the phenomenon of undercut badness can be effectively solved.

Additionally, the production method according to the embodiments described above in this disclosure may further have additional technical features as follows.

According to an embodiment of this disclosure, before forming the passivation layer on the base substrate, it further comprises: forming a source/drain electrode layer on the base substrate, wherein the source/drain electrode layer and the passivation layer are formed in the same side of the base.

According to an embodiment of this disclosure, forming the passivation layer further comprises: forming a transition sublayer on a side of the source/drain electrode layer on the base away from the base; forming a main sublayer on a side of the transition sublayer away from the base; and forming a top sublayer on a side of the main sublayer away from the base.

According to an embodiment of this disclosure, the ions injected are aluminum ions.

According to an embodiment of this disclosure, the method for injecting aluminum ions is a metal evaporation vacuum arc ion injection method.

According to an embodiment of this disclosure, a cathode material used in the metal evaporation vacuum arc ion injection method is metal aluminum having a purity of no less than 90 w/w %.

According to an embodiment of this disclosure, the aluminum ion have an injection dosage of $4\times10^{16}$ to $6\times10^{16}$ ions/cm$^2$.

According to an embodiment of this disclosure, the gas used in the etching is $O_2$ and at least one of $SF_6$ and $CF_4$.

In an aspect of this disclosure, there is proposed an array substrate.

According to an embodiment of this disclosure, the array substrate is obtained by the method described above.

With respect to the array substrate in embodiments of this disclosure, the problem of discontinuity of the contact between the top ITO layer and the S/D electrode will not easily occur, and it has a higher yield rate. It is to be understood by a person skilled in the art that the characteristics and advantages described previously with respect to the method of producing the array substrate are also applicable to this array substrate, and verbose words are omitted herein.

In an aspect of this disclosure, there is proposed a display apparatus.

According to an embodiment of this disclosure, the display apparatus comprises the array substrate described above.

With respect to the display apparatus in embodiments of this disclosure, the phenomenon of discontinuity of the contact between the top ITO layer and the S/D electrode of its array substrate will not occur, and it has a higher yield rate and a better display quality. It is to be understood by a person skilled in the art that the characteristics and advantages described previously with respect to the method of producing the array substrate and the array substrate are also applicable to this display apparatus, and verbose words are omitted herein.

Embodiments of this disclosure will be described in detail below. It is to be understood by a person skilled in the art that the embodiments below aim to explain this disclosure and are not to be construed as limiting this disclosure. Unless particularly illustrated, a person skilled in the art may perform operations according to techniques or conditions commonly used in the art or according to product instructions when specific techniques or conditions are not described in the embodiments below. Any agent or instrument used, which is not denoted with any manufacturer, may be a conventional product which is commercially available.

In an aspect of this disclosure, this disclosure proposes a method of producing an array substrate. With reference to FIGS. 3 to 10, the production method of this disclosure will be described in detail. According to an embodiment of this disclosure, with reference to FIG. 3, this production method comprises:

S100: forming a passivation layer on a base substrate

Figure 11:
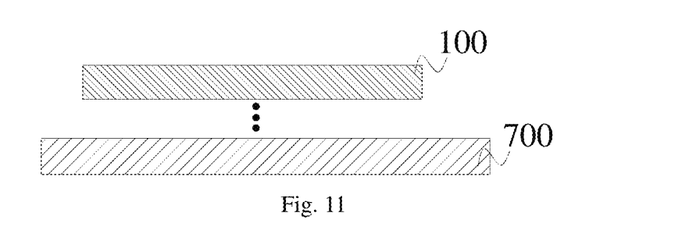
FIG. 11 is a structural schematic diagram of a base obtained in Step S100 of a production method in an embodiment of this disclosure.

In this step, with reference to FIG. 11, a passivation layer 100 is formed on a base substrate 700. According to an embodiment of this disclosure, the specific method of obtaining this base substrate 700 is not particularly limited, and for example, it is commercially available or self-made, as long as this base substrate 700 satisfies application requirements. Selections may be made by a person skilled in the art according to practical circumstances.

According to an embodiment of this disclosure, the passivation layer 100 may be directly formed on a side of the base substrate 700, other layer structures may also be provided between the passivation layer 100 and the base substrate 700, for example an S/D electrode layer, a gate electrode, a gate insulating layer, a pixel electrode layer, and the like with reference to FIG. 11 (" . . . " is used to briefly represent other layer structures in FIG. 11). Designs and supplements may be made by a person skilled in the art according to application requirements for this array substrate, and verbose words are omitted herein.

In some embodiments of this disclosure, a source/drain electrode layer (S/D electrode layer) 200 may be further comprised between the base substrate 700 and the passivation layer 100, wherein the source/drain electrode layer 200 and the passivation layer 100 are formed on the same side of the base substrate 700. That is, the passivation layer 100 is formed on a surface of a side of the S/D electrode layer 200 away from the base substrate 700. By setting the position of the S/D electrode layer 200 in this way, after a via hole 500 is formed on the passivation layer 100, a top ITO is then formed and may be directly electrically connected to the S/D electrode layer 200. In some specific examples, other layer structures, besides the S/D electrode layer, may be further comprised between the transition layer 100 and the base substrate 700. A bottom gate structure is exemplified, and specific examples are a gate electrode, a gate insulating layer, a pixel electrode layer, and the like. Designs may be made by a person skilled in the art according to practical requirements for the array substrate.

According to an embodiment of this disclosure, the specific material of this passivation layer 100 is not particularly limited and may be any material for a passivation layer known in the art, as long as the material of this passivation layer 100 satisfies application requirements. Selections may be made by a person skilled in the art according to practical circumstances. In some embodiments of this disclosure, the material of this passivation layer 100 may be $SiN_x$. In this way, the passivation layer using the material described above has a better protective effect on the array substrate.

Figure 4:
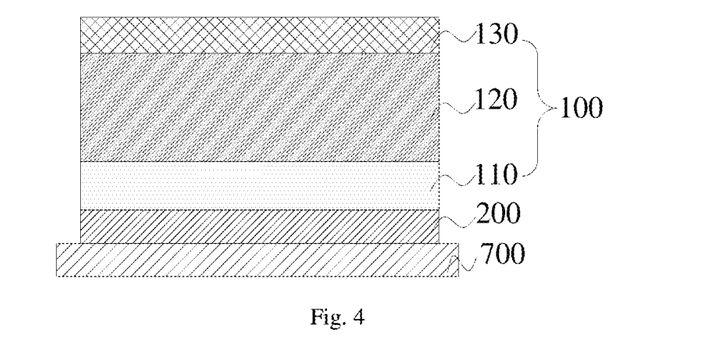
FIG. 4 is a structural schematic diagram of a base in an embodiment of this disclosure.

According to an embodiment of this disclosure, with reference to FIG. 4, this passivation layer 100 may further comprise: a transition sublayer 110, a main sublayer 120, and a top sublayer 130. Here, the transition sublayer 110 is formed on a side of the S/D electrode layer 200 away from the base substrate 700; the main sublayer 120 is formed on a side of the transition sublayer 110 away from the base substrate 700; and the top sublayer 130 is formed on a side of the main sublayer 120 away from the transition sublayer 110. By means of this design, the effect of the top sublayer 130 is allowing the etched groove in the process of plasma etching to achieve certain slope angle and size, and the effect of the transition sublayer 110 is preventing the generation of phenomena of badnesses such as black spot which is easily caused by direct contact between the main sublayer 120 and the pixel electrode. Therefore, by selecting the passivation layer 100 having the composite structure described above, smooth etching of the via hole 500 and good etching effects can be effectively ensured.

According to an embodiment of this disclosure, specific methods of forming the transition sublayer 110, the main sublayer 120, and the top sublayer 130 are not particularly limited and may be conventional methods of forming respective sublayers of the passivation layer in the art, as long as these methods can form the passivation layer having a composite structure. Selections may be made by a person skilled in the art according to the practical production process and the specific design of the passivation layer, and verbose words are omitted herein.

Figure 5:
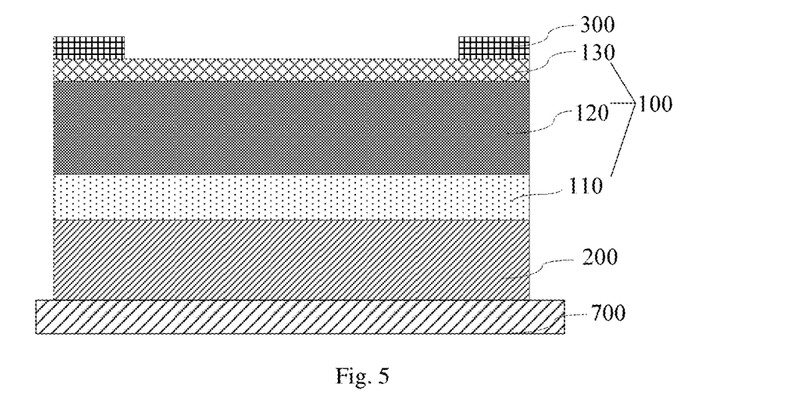
FIG. 5 is a structural schematic diagram of an array substrate obtained in Step S200 of a production method in an embodiment of this disclosure.
Figure 9:
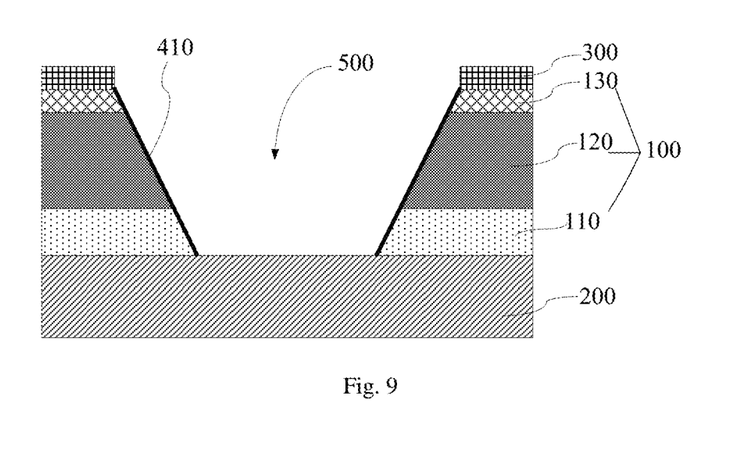
FIG. 9 is a structural schematic diagram of an array substrate obtained in Step S400 of a production method in an embodiment of this disclosure.

S200: forming a photoresist layer on the passivation layer, and performing a patterning process on the photoresist layer to form a photoresist mask having an opening pattern In this step, with reference to FIG. 5, a photoresist mask is formed on a surface of a side of the top sublayer 130 of the passivation layer 100 away from the base substrate 700, and a patterning process is performed on this photoresist mask 300 to form a photomask 300 having an opening pattern. In this way, by means of the photoresist mask 300 having a pattern corresponding to a via hole 500, the passivation layer 100 is allowed to form a via hole 500 at a specific position (as shown in FIG. 9). For example, a pixel electrode is connected to a drain electrode through the via hole.

According to an embodiment of this disclosure, the specific material of the photoresist mask 300 is not particularly limited and may be any material for a photomask commonly used in the art, as long as the material of this photoresist mask can protect the passivation layer which is not in an area of the via hole from being etched. Selections may be made by a person skilled in the art according to the specific material of the passivation layer 100 and the subsequent specific process of etching of the via hole 500. In some embodiments of this disclosure, the photoresist mask 300 may be a photoresist material. In this way, by using the photoresist mask 300 formed from a photoresist material, it is ensured that the passivation layer which is not in an area of the via hole will not be subsequently impacted by etching and the photoresist mask 300 will be easily removed after etching is complete, which will not influence the utilization property and the surface morphology of the passivation layer 100.

According to an embodiment of this disclosure, the specific thickness of the photoresist mask 300 is not particularly limited and may be any thickness for a photoresist mask commonly used in the art, as long as the thickness of this photoresist mask can effectively protect the passivation layer which is not in an area of the via hole from being etched. Selections may be made by a person skilled in the art according to the specific process of subsequent etching of the via hole 500, and verbose words are omitted herein.

S300: introducing an etching resistant layer precursor material to the passivation layer by ion injection through the opening pattern In this step, ions are injected in an area of the passivation layer, which corresponds to the opening pattern of the photomask 300 and is on a surface of a side of the passivation layer 100 away from the base substrate 700, so as to adjust and control the speed and the angle of a subsequent etching treatment.

Figure 6:
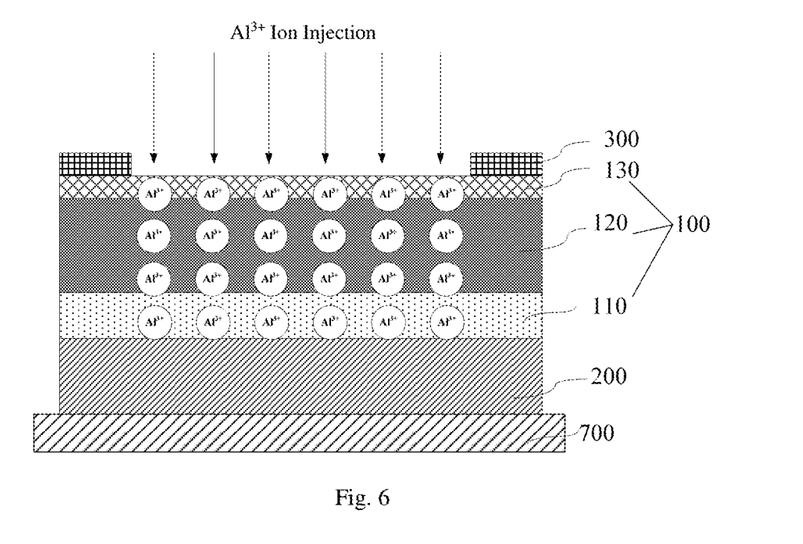
FIG. 6 is a schematic diagram of the injection of metal aluminum ions in Step S300 of a production method in an embodiment of this disclosure.
Figure 7:
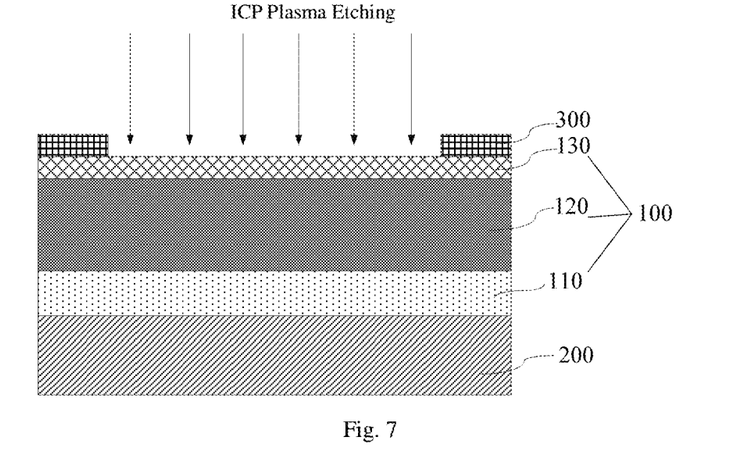
FIG. 7 is a schematic diagram of an etching process in Step S400 of a production method in an embodiment of this disclosure.

According to an embodiment of this disclosure, the specific type of the ions injected as the etching resistant layer precursor material is not particularly limited, as long as these ions can effectively adjust and control the angle of etching in a subsequent etching process. Selections may be made by a person skilled in the art according to a practical etching process. In some embodiments of this disclosure, the ions injected may be aluminum ions. With reference to FIG. 6, FIG. 6 is a schematic effect denoted after magnification, in order to figuratively represent the effect after metal aluminum ion injection is complete. In this way, metal aluminum ions preliminarily injected in the etching process can react with the etching gas in the subsequent etching treatment to generate a protective film, and the etching speed and the etching angle can be adjusted and controlled. Therefore, the problem of undercut chamfer brought about by different etching speeds of the transition sublayer and the main sublayer may be solved.

According to an embodiment of this disclosure, the specific method of injecting metal aluminum ions is not particularly limited, as long as this method can uniformly inject metal aluminum ions into the passivation layer. Selections may be made by a person skilled in the art according to the specific material of the passivation layer and the specific process of subsequent etching of the via hole 500. In some embodiments of this disclosure, a metal evaporation vacuum arc ion injection method may be used as the method of injecting metal aluminum ions. In this way, by using the metal evaporation vacuum arc ion injection method, it may be effective in uniformly injecting metal aluminum ions into the entire passivation layer.

According to an embodiment of this disclosure, specific process parameters when the metal evaporation vacuum arc ion injection method is used are not particularly limited, as long as these process parameters can uniformly inject metal aluminum ions into the passivation layer. Settings may be made by a person skilled in the art according to the specific material and thickness of the passivation layer. In some embodiments of this disclosure, metal aluminum having a purity of no less than 90 wt % may be used as a specific cathode material in the metal evaporation vacuum arc ion injection method. In this way, by using the cathode material having the purity described above, the effect of injection of aluminum ions and the effect of adjustment and control of subsequent etching can be better. In some embodiments of this disclosure, the specific injection dosage of metal aluminum ions may be $4 \times 10^{16}$ ions/cm$^2$ to $6 \times 10^{16}$ ions/cm$^2$. In this way, by using the injection dosage described above, metal aluminum ions may be injected into the entire passivation layer more completely and uniformly, and thus the effect of adjustment and control of subsequent etching is better. In some specific examples of this disclosure, a metal evaporation vacuum arc ion injection system is used, and metal aluminum having a purity of 99.99 wt % is used as its cathode material. A target chamber is first evacuated to $10^{-4}$ Pa before ion injection, and injection of metal aluminum ions are then performed under ion injection process parameters of a pulse frequency of 20 Hz, an accelerating voltage of 40 keV, and an injection dosage of $5 \times 10^{16}$ ions/cm$^2$. In this way, by using the process parameters of the metal evaporation vacuum arc ion injection method described above, it is possible to obtain the optimal effect of injection of aluminum ions and the optimal effect of adjustment and control of subsequent etching.

S400: generating plasma by using an etching gas, etching the passivation layer by using the plasma through the opening pattern to form a via hole penetrating the passivation layer In this step, etching treatment is performed on the passivation layer 100 corresponding to the opening pattern of the photomask 300 so as to form a via hole 500 penetrating the passivation layer 100.

According to an embodiment of this disclosure, the specific method of this etching is not particularly limited, as long as this etching method can effectively form the via hole penetrating the passivation layer by etching and does not damage non-via-hole areas. Selections may be made by a person skilled in the art according to the specific material of the passivation layer. In some embodiments of this disclosure, the via hole of the passivation layer may be obtained by using an inductively coupled plasma (ICP) etching apparatus. In this way, with reference to FIG. 7, this ICP etching apparatus continuously bombards the passivation layer 100 which is not protected by the photomask 300 by using plasma downwardly moving at a high speed so as to form an etched groove 400 in the process of etching. A specific structural schematic diagram can be referred to FIG. 8. The via hole 500 is formed after etching is complete. A specific structural schematic diagram can be referred to FIG. 9.

The plasma comprises a substance which is capable of reacting with the etching resistant layer precursor material to form an etching resistant layer which is resistant to isotropic etching, so that the etching resistant layer is formed on a surface of the passivation layer during the etching.

According to an embodiment of this disclosure, the gas used in this etching is not particularly limited, as long as this etching gas can effectively etched off the passivation layer and can form a protective film with the preliminarily injected metal aluminum ions. Selections may be made by a person skilled in the art according to the specific material of the passivation layer and the specific method of the etching treatment. In some embodiments of this disclosure, the etching gas may be a combined gas, i.e., $O_2$ and at least one of $SF_6$ and $CF_4$. In this way, by using the combined etching gas described above, $O_2$ therein can form a protective film of $Al_2O_3$ with preliminarily injected $Al^{3+}$ so as to be capable of adjusting and controlling the direction and the speed of the etching process.

Figure 8:
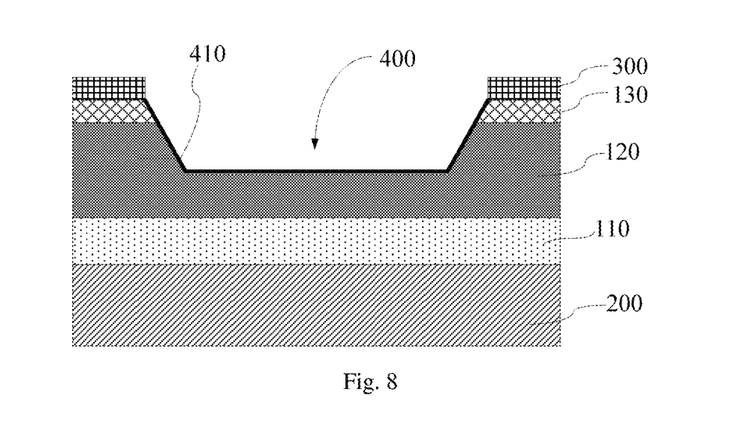
FIG. 8 is a schematic diagram of a process of forming an etched groove in Step S400 of a production method in an embodiment of this disclosure.

With reference to FIG. 8, O plasma of the combined etching gas can react with $Al^{3+}$ to generate a thin layer of $Al_2O_3$ protective film 410 on the two side walls and the bottom wall of the etched groove 400 in the process of etching. Since the plasma formed by the ICP etching apparatus downwardly moves at a high speed, the $Al_2O_3$ thin film 410 on the bottom wall of the etched groove 400 will be more easily bombarded off, so that downward etching is continued. The etching speeds on the two side walls are lower, and it is favorable to form an etched groove 400 having certain slope and smoothness. Accordingly, the preliminarily injected metal aluminum ions react with $O_2$ in the combined etching gas to generate an $Al_2O_3$ thin film, so as to be capable of effectively adjusting and controlling the direction and the speed of the etching process. Therefore, the problem of the reduced yield rate of the manufacture of the array substrate brought about by the phenomenon of undercut chamfer can be effectively solved.

According to an embodiment of this disclosure, specific process parameters, for example etching time and the like, of the etching treatment are not particularly limited, as long as the process parameters of this etching treatment can allow the passivation layer to form a via hole. Designs and adjustments may be made by a person skilled in the art according to the specific material and thickness of the passivation layer as well as practical circumstances of etching, and verbose words are omitted herein.

S500: peeling the photoresist mask

Figure 10:
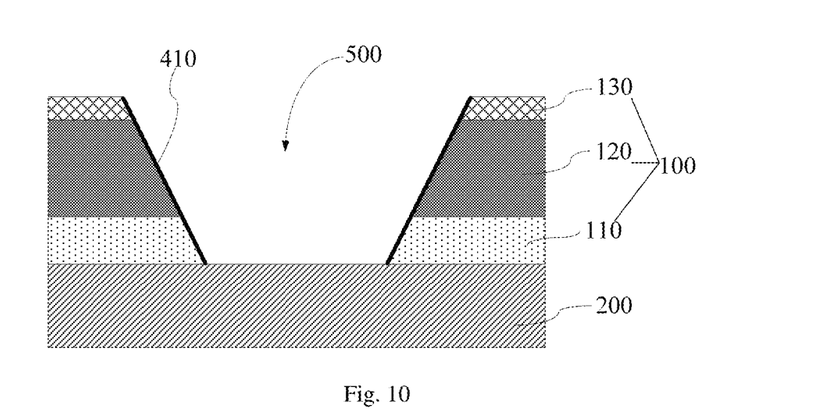
FIG. 10 is a structural schematic diagram of an array substrate obtained in Step S500 of a production method in an embodiment of this disclosure.

In this step, the photoresist mask 300 may be peeled from the surface of the passivation layer 100 after the etching treatment is complete, so as to obtain the via hole 500, with reference to FIG. 10. According to an embodiment of this disclosure, the specific method of peeling the photoresist mask 300 is not particularly limited, as long as this peeling method can allow the photoresist mask 300 to effectively depart from an area of the passivation layer which is not etched and will not impact the property and the surface quality of the passivation layer. Selections may be made by a person skilled in the art according to the properties of the passivation layer 100 and the photoresist mask 300, and verbose words are omitted herein.

In summary, according to an embodiment of this disclosure, this disclosure proposes a production method, wherein metal aluminum ions are preliminarily injected so that a thin layer of protective film on the two side walls and the bottom wall of the groove in the etching process of the passivation layer. Since the protective film on the bottom wall will be etched off more easily compared to that on the two side walls, the etching speed in the vertical direction is higher than the etching speed in the lateral direction. Therefore, the etching direction of the passivation layer may be effectively controlled, and the problem of the reduced yield rate of the manufacture of the array substrate brought about by the phenomenon of undercut chamfer can be effectively solved.

When an ITO layer is further formed on the passivation layer, the problem of discontinuity of the contact as shown in FIG. 2 will not occur since there is no undercut chamfer.

In another aspect of this disclosure, this disclosure proposes an array substrate. According to an embodiment of this disclosure, this array substrate is obtained by the method described above.

In summary, according to an embodiment of this disclosure, this disclosure proposes an array substrate, wherein the problem of discontinuity of the contact between the top ITO layer and the S/D electrode of this array substrate will not easily occur, and it has a higher yield rate. It is to be understood by a person skilled in the art that the characteristics and advantages described previously with respect to the method of producing the array substrate still apply to this array substrate, and verbose words are omitted herein.

In another aspect of this disclosure, this disclosure proposes a display apparatus. According to an embodiment of this disclosure, this display apparatus comprises the array substrate described above.

According to an embodiment of this disclosure, the specific type of this display apparatus is not particularly limited and may be any display apparatus type known in the art. Specific examples include televisions, cell phones, computer display screens, flat panel displays, game consoles, wearable devices, living and domestic appliances having display panels, and the like. Selections may be made by a person skilled in the art according to practical use conditions of the display apparatus, and verbose words are omitted herein.

It is to be indicated that this display apparatus further comprises other essential components or structures, in addition to the array substrate. By taking an LED display as an example, it may further comprise a color filter substrate, a light source component, a control component, a circuit, a shell, and the like. Supplements and designs may be made by a person skilled in the art according to the specific type of the display apparatus, and verbose words are omitted herein.

In summary, according to an embodiment of this disclosure, this disclosure proposes a display apparatus, wherein the phenomenon of discontinuity of the contact between the top ITO layer and the S/D electrode of its array substrate will not occur, and it has a higher yield rate and a better display quality. It is to be understood by a person skilled in the art that the characteristics and advantages described previously with respect to the method of producing the array substrate and the array substrate still apply to this display apparatus, and verbose words are omitted herein.

In the description of this disclosure, it is to be understood that orientations and positional relationships indicated by terms "center", "longitudinal", "lateral", "length", "width", "thickness", "on", "under", "before", "after", "left", "right", "vertical", "horizontal", "top", "bottom", "in", "out", "clockwise", "anticlockwise", "axial", "radial", "circumferential", and the like, are based on orientations or positional relationships as shown in figures. They are merely intended to facilitate the description of this disclosure and simplify the description, but do not indicate or imply that indicated apparatuses or elements necessarily have specific orientations and are configured and operated in specific orientations. Therefore, they may not be understood as limit to this disclosure.

In the description of this specification, The description with reference to terms "one embodiment", "some embodiments", "an example", "a specific example", or "some examples", and the like means that specific characteristics, structures, materials, or features described in conjunction with this embodiment or example are included in at least one embodiment or example of this disclosure. In this specification, the illustrative expression of the above terms is not necessarily directed to the same embodiment or example. Additionally, the specific characteristics, structures, materials, or features described may be conjoined in any one or several embodiment(s) or example(s) in a suitable manner. Furthermore, different embodiments or examples described in this specification and characteristics in different embodiments or examples may be conjoined and combined by a person skilled in the art without contradiction.

Although the embodiments of this disclosure are illustrated and described above, it can be appreciated that the embodiments described above are exemplary and cannot be understood as limiting this disclosure. Alternations, modifications, substitution, and variations may be made to the embodiments described above by those of ordinary skill in the art in the scope of this disclosure.

What is claimed is:

1. A method of producing an array substrate, comprising:
forming a passivation layer on a base substrate;
forming a photoresist layer on the passivation layer, and performing a patterning process on the photoresist layer to form a photoresist mask having an opening pattern;
introducing an etching resistant layer precursor material to the passivation layer by ion injection through the opening pattern;
generating plasma by using an etching gas, etching the passivation layer by using the plasma through the opening pattern to form a via hole penetrating the passivation layer; and
peeling the photoresist mask,
wherein
the plasma comprises a substance which is capable of reacting with the etching resistant layer precursor material to form an etching resistant layer which is resistant to isotropic etching, so that the etching resistant layer is formed on a surface of the passivation layer during the etching,
wherein the etching resistant layer precursor material includes $Al^{3+}$ ions, the etching gas comprises $O_2$, the substance which is capable of reacting with the etching resistant layer precursor material to form an etching resistant layer is oxygen plasma, and the etching resistant layer is an $Al_2O_3$ layer.

2. The method according to claim 1, wherein the ion injection is metal evaporation vacuum arc ion injection.

3. The method according to claim 2, wherein a cathode material in the metal evaporation vacuum arc ion injection is metal aluminum having a purity of no less than 90 wt %.

4. The method according to claim 2, wherein the $Al^{3+}$ ions have an injection dosage of $4\times10^{16}$ to $6\times10^{16}$ ions/cm$^2$.

5. The method according to claim 1, wherein the plasma further comprises $F^+$.

6. The method according to claim 5, wherein the etching gas comprises at least one of $SF_6$ and $CF_4$.

7. The method according to claim 1, wherein the passivation layer is produced from a silicon nitride.

8. The method according to claim 1, wherein before forming the passivation layer on the base substrate, the method further comprises:

forming a source/drain electrode layer on the base substrate.

9. The method according to claim 8, further comprising:

after forming the via hole, forming a top ITO on the passivation layer, wherein the top ITO is in electrical connection with the source/drain electrode layer through the via hole.

10. The method according to claim 8, wherein forming the passivation layer on the base substrate comprises:

forming a transition sublayer on a side of the source/drain electrode layer away from the base substrate;

forming a main sublayer on a side of the transition sublayer away from the base substrate; and forming a top sublayer on a side of the main sublayer away from the base substrate.

11. An array substrate produced by a method, wherein the method comprises:

forming a passivation layer on a base substrate;

forming a photoresist layer on the passivation layer, and performing a patterning process on the photoresist layer to form a photoresist mask having an opening pattern;

introducing an etching resistant layer precursor material to the passivation layer by ion injection through the opening pattern;

generating plasma by using an etching gas, etching the passivation layer by using the plasma through the opening pattern to form a via hole penetrating the passivation layer; and peeling the photoresist mask, wherein the plasma comprises a substance which is capable of reacting with the etching resistant layer precursor material to form an etching resistant layer which is resistant to isotropic etching, so that the etching resistant layer is formed on a surface of the passivation layer during the etching, wherein the etching resistant layer is an $Al_2O_3$ layer, wherein the array substrate comprises:

the base substrate;

the passivation layer on the base substrate, wherein the passivation layer comprises the via hole, and the via hole has a side wall, on which the etching resistant layer is formed.

12. A display apparatus comprising the array substrate according to claim 11.

13. The array substrate according to claim 11, wherein the passivation layer is produced from a silicon nitride.

14. The array substrate according to claim 11, wherein the passivation layer comprises:

a transition sublayer on the base substrate;

a main sublayer on a side of the transition sublayer away from the base substrate; and a top sublayer on a side of the main sublayer away from the base substrate.

15. The array substrate according to claim 11, further comprising:

a top ITO on the passivation layer; and a source/drain electrode layer on the base substrate, wherein the top ITO is in electrical connection with the source/drain electrode layer through the via hole.

* * * * *